United States Patent [19]

Terada et al.

[11] Patent Number: 5,022,009
[45] Date of Patent: Jun. 4, 1991

[54] SEMICONDUCTOR MEMORY DEVICE HAVING READING OPERATION OF INFORMATION BY DIFFERENTIAL AMPLIFICATION

[75] Inventors: Yasushi Terada; Takeshi Nakayama; Kazuo Kobayashi, all of Hyogo, Japan

[73] Assignee: Mitsubishi Denki Kabushiki Kaisha, Tokyo, Japan

[21] Appl. No.: 310,116

[22] Filed: Feb. 14, 1989

[30] Foreign Application Priority Data

Jun. 2, 1988 [JP] Japan .................................. 63-136308

[51] Int. Cl.$^5$ .......................... G11C 7/02; G11C 11/40
[52] U.S. Cl. .................................... 365/210; 365/185; 365/189.09
[58] Field of Search ............... 365/210, 185, 206, 207, 365/208, 189.09

[56] References Cited

U.S. PATENT DOCUMENTS

| 4,606,010 | 8/1986 | Saito | 365/149 |
| 4,654,831 | 3/1987 | Venkatesh | 365/210 X |
| 4,677,590 | 6/1987 | Arakawa | 365/210 X |
| 4,694,427 | 9/1987 | Miyamoto et al. | 365/210 |
| 4,805,143 | 2/1989 | Matsumoto et al. | 365/210 X |
| 4,819,212 | 4/1989 | Nakai et al. | 365/185 X |

FOREIGN PATENT DOCUMENTS 61-73300  4/1986  Japan .

OTHER PUBLICATIONS

IEEE Journal of Solid-State Circuit-vol. SC-15, No. 5, Oct. 1980, pp. 831–839.
Dumitru Cioaca et al., "A Million-Cycle CMOS 256K EEPROM", *IEEE Journal of Solid-State Circuits*, vol. SC-22, No. 5, Oct. 1987, pp. 684–692.
Fujio Masuoka et al., "A 256-Kbit Flash E$^2$PROM Using Triple-Polysilicon Technology", *IEEE Journal of Solid-State Circuits*, vol. SC-22, No. 4, Aug. 1987, pp. 548–552.
Masanobu Yoshida et al., "An 80 ns Address-Date Multiplex 1 Mb CMOS EPROM", *IEEE International Solid-State Circuits Conference*, Feb. 25, 1987, pp. 70, 71 and 342.

*Primary Examiner*—James W. Moffitt
*Attorney, Agent, or Firm*—Lowe, Price, Leblanc, Becker & Shur

[57] ABSTRACT

First and second bit lines are arranged on one side of each sense amplifier while third and fourth bit lines are arranged on the other side thereof. A first dummy cell is connected to either the first bit line or the second bit line. In addition, a second dummy cell is connected to either the third bit line or the fourth bit line. When a memory cell connected to the first bit line is selected, the second dummy cell is simultaneously selected. On this occasion, the first bit line is connected to a first terminal of the sense amplifier, and the third bit line and the fourth bit line are connected to a second terminal of the sense amplifier. Potentials of the first and second terminals are differentially amplified. On the other hand, when a memory cell connected to the third bit line is selected, the first dummy cell is simultaneously selected. On this occasion, the third bit line is connected to the second terminal of the sense amplifier, and the first bit line and the second bit line are connected to the first terminal of the sense amplifier. The potentials of the first and second terminals are differentially amplified.

11 Claims, 10 Drawing Sheets

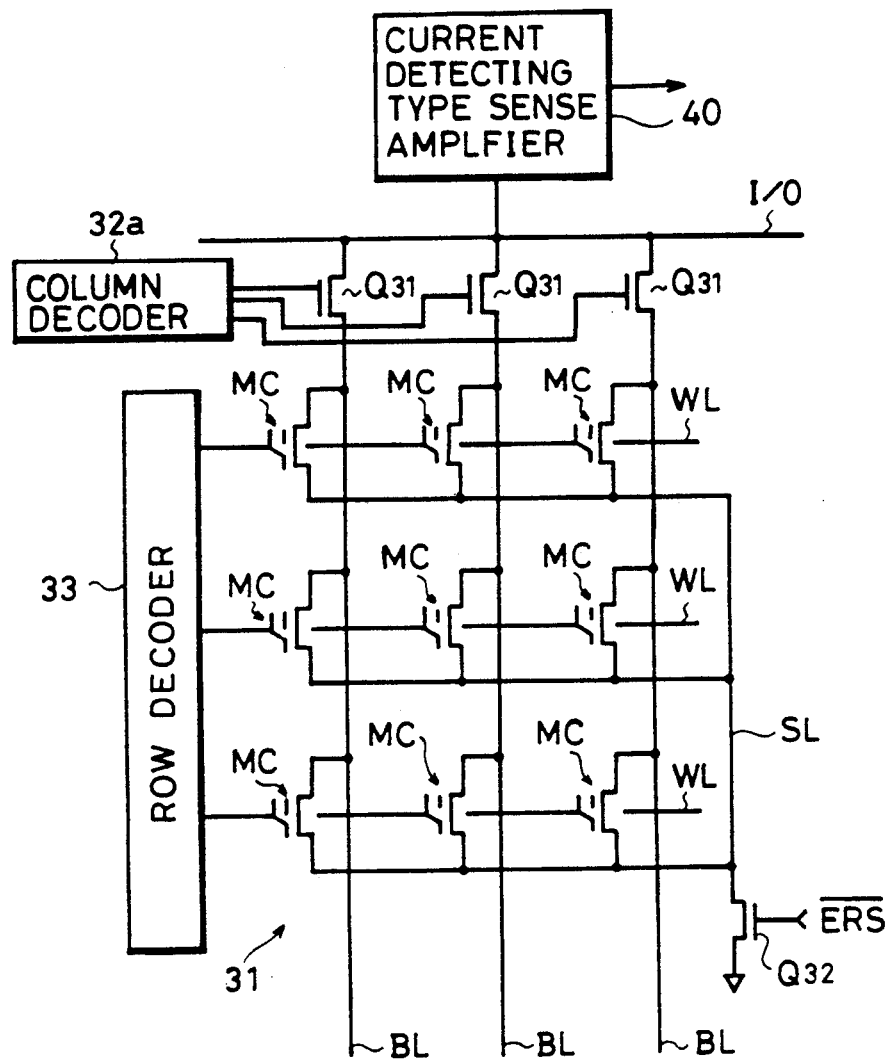
FIG. 2 PRIOR ART
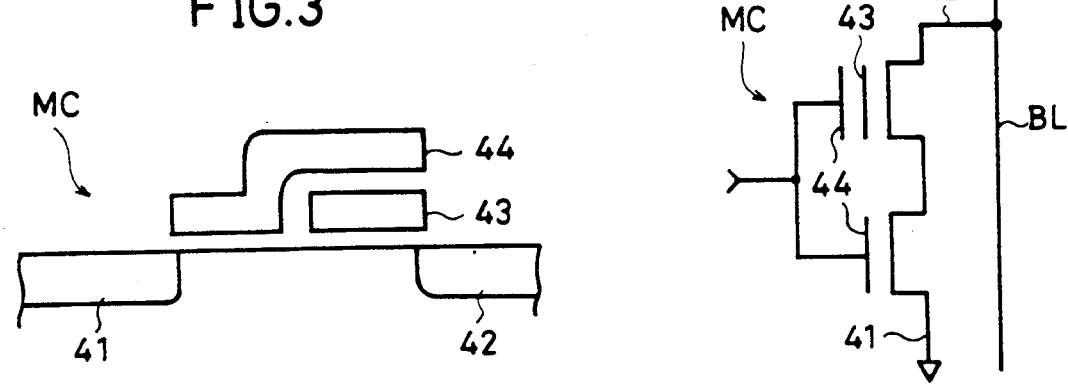
FIG. 3
FIG. 4 ial density is in-

SIMICONDUCTOR MEMORY DEVICE HAVING READING OPERATION OF INFORMATION BY DIFFERENTIAL AMPLIFICATION

BACKGROUND OF THE INVENTION

1. Field of the Invention

The present invention relates generally to semiconductor memory devices, and more particularly, to a semiconductor memory device in which high-speed access can be made even if integration density is increased.

2. Description of the Prior Art

FIG. 1 is a block diagram showing the entire structure of a conventional collectively erasable type of electrically erasable and programmable read-only memory (referred to as flush EEPROM hereinafter).

In FIG. 1, the flush EEPROM includes a plurality of memory cell arrays 31. Each of the memory cell arrays 31 is provided with a column decoder/Y gate 32. In addition, the plurality of memory cell arrays 31 are provided with a common row decoder 33. A column address signal is applied to the plurality of column decoder/Y gates 32 from a Y address buffer 34. A row address signal is applied to the row decoder 33 from an X address buffer 35. On the other hand, sense amplifier/write drivers 36 are connected to the column decoder/Y gates 32 through I/O lines I/O, respectively. A common input/output buffer 37 is connected to the plurality of sense amplifier/write drivers 36.

A chip enable signal $\overline{CE}$, a write enable signal $\overline{WE}$ and an output enable signal $\overline{OE}\pi$are externally applied to a control signal input buffer 38. The control signal input buffer 38 is responsive to the signals for applying a control signal to a write/read timing generating circuit 39. The write/read timing generating circuit 39 is responsive to this control signal for generating various timing signals, to control a writing operation and a reading operation.

Each of the memory cell arrays 31 includes a plurality of memory cells arranged in a matrix as described below. The row decoder 33 is responsive to the row address signal applied from the X address buffer 35 for selecting one row in the memory cell arrays 31. The column decoder/Y gates 32 are responsive to the column address signal applied from the Y address buffer 34 for selecting columns in the memory cell arrays 31, respectively Data are read out from memory cells respectively provided at intersections of the rows and the columns, amplified by respective sense amplifiers in the sense amplifier/write drivers 36, and outputted through the input/output buffer 37.

FIG. 2 is a circuit diagram showing a structure of one of the memory cell arrays 31 included in the flush EEPROM shown in FIG. 1.

In FIG. 2, a plurality of memory cells MC are arranged in a matrix in the memory cell array 31. A bit line BL is arranged in each column of the plurality of memory cells MC. The memory cells MC have their drains connected to the bit line BL. The bit lines BL are connected to an I/O line I/O through N channel MOS transistors Q31, respectively. The plurality of transistors Q31 constitute a Y gate included in each of the column decoder/Y gates 32 shown in FIG. 1. Each of the transistors Q31 has its gate connected to a column decoder 32a included in each of the column decoder/Y gates 32. In addition, a word line WL is provided in each row of the plurality of memory cells MC. The memory cells MC have their control gates connected to the word line WL. A plurality of word lines WL are connected to a row decoder 33. All the memory cells MC have their sources connected to ground through a source line SL and an N channel MOS transistor Q32. The transistor Q32 has its gate receiving an erase signal $\overline{ERS}$. On the other hand, a current detecting type sense amplifier 40 included in each of the sense amplifier/write drivers 36 is connected to the I/O line I/O.

FIG. 3 is a cross sectional view showing a memorY transistor constituting a memory cell MC, and FIG. 4 is a diagram showing an equivalent circuit of the memory transistor.

The memory transistor comprises a source 41, a drain 42, a floating gate 43 and a control gate 44. Data "1" or "0" is stored in the memory transistor depending on whether or not electrons are stored in the floating gate 43. More specifically, when electrons are stored in the floating gate 43, the threshold voltage of the memory transistor becomes high. Consequently, if and when a predetermined voltage is applied to the control gate 44, a path between the source 41 and the drain 42 is rendered non-conductive. Contrary to this, when electrons are emitted from the floating gate 43, the threshold voltage of the memory transistor becomes low. Consequently, if a predetermined voltage is applied to the control gate 44, the path between the source 41 and the drain 42 is rendered conductive. Thus, an on or off state of the memory transistor corresponds to data "0" or "1" to be stored.

Description is now made on an erasing operation, a writing operation and a reading operation of the flush EEPROM shown in FIG. 2.

In the erasing operation, as shown in FIG. 5A, a high voltage $V_{PP}$ is applied to all the bit lines BL, and all the word lines WL are grounded. On this occasion, the erase signal $\overline{ERS}$ is brought to an "L" level, so that the transistor Q32 is rendered non-conductive, whereby the source line SL remains electrically floating. Consequently, as shown in FIG. 5B, electrons stored in the floating gate 43 in the memory transistor are emitted into the drain 42 by a tunnel phenomenon. As a result, the threshold voltage of the memory transistor becomes low. In the above described manner, data stored in all the memory cells MC are simultaneously erased.

In the writing operation, as shown in FIG. 6A, the high voltage $V_{PP}$ is applied to a selected bit line BL and a selected word line WL. On this occasion, the erase signal $\overline{ERS}$ is brought to an "H" level. As a result, the transistor Q32 is turned on, so that the source line SL is grounded. Consequently, as shown in FIG. 6B, avalanche breakdown occurs in the vicinity of the drain 42 in the memory transistor, so that hot electrons are injected into the floating gate 43. Therefore, the threshold voltage of the memory transistor becomes high. In the above described manner, data is written to a memory cell MC enclosed by a broken line in FIG. 6A.

Description is now made on the reading operation of the flush EEPROM. In FIG. 2, any of the plurality of word lines WL is selected by the row decoder 33, so that an "H" level potential is applied to the word line. In addition, any of the plurality of transistors Q31 is selected by the column decoder 32a, so that the "H" level potential is applied to a gate of the selected transistor. Thus, one memory cell MC is selected. The current detecting type sense amplifier 40 connected to the I/O line I/O determines whether or not a current flows from a drain to a source of the selected memory cell MC.

FIG. 7 is a circuit diagram showing the current detecting type amplifier 40 shown in FIG. 2. The current detecting type sense amplifier 40 is disclosed in, for example, Japanese Patent Laying-Open Gazette No. 170097/1987.

The sense amplifier 40 comprises a current-voltage converting circuit 40a for converting to a voltage signal a current corresponding to data stored in a memory cell MC, and an inverter circuit 40b for inverting the converted voltage signal. The current-voltage converting circuit 40a comprises P channel MOS transistors Q41 and Q42 and N channel MOS transistors Q43, Q44 and Q45.

First, in the reading operation, when the memory cell MC is rendered conductive, a potential of a node N11 becomes approximately 1.0 V in a steady state. Consequently, the transistor Q43 is slightly turned on, so that a potential of a node N12 becomes approximately 2 V. Therefore, the transistors Q44 and Q45 are slightly turned on. However, since the on-resistance of the transistor Q42 is set to be larger than that of the transistor Q45, a potential of a node N13 becomes approximately the same (i.e., 1.0 V) as the potential of the node N11.

Then, in the reading operation, when the memory cell MC is rendered non-conductive, the potential of the node N11 becomes approximately 1.1 V. Consequently, the potential of the node N12 becomes approximately 1.8 V, so that the potential difference between a gate and a source of each of the transistors Q44 and Q45 becomes approximately 0.7 V. Thus, the transistors Q44 and Q45 are turned off, so that the potential of the node N13 is pulled up to 5 V.

When the size of a memory cell is decreased as the semiconductor memory device is made finer and the integration density thereof is increased, a current (cell current) flowing through the memory cell is reduced. In order to detect this reduced cell current, the sensitivity of the current detecting type sense amplifier must be increased. However, when the size of a load transistor, (for example, the transistor Q42 shown in FIG. 7) in the sense amplifier is decreased in order to increase the sensitivity of the sense amplifier, the access time is delayed, so that the reading operation is not speeded up.

On the other hand, Japanese Patent Laying-Open Gazette No. 73300/1986 discloses a semiconductor memory device using a differential amplifier circuit. In this semiconductor memory device, a pair of bit lines 51 and 52 are connected to both sides of a differential amplifier circuit 59, as shown in FIG. 8. A plurality of memory cells 55A (only one memory cell is illustrated in FIG. 8) and one dummy cell 58A are connected to the bit line 51, and a plurality of memory cells 55B (only one memory cell is illustrated in FIG. 8) and one dummy cell 58B are connected to the bit line 52.

At the time of the reading operation, the bit lines 1 and 52 are charged to a power-supply potential $V_{DD}$ When one of the memory cells 55A connected to the bit line 1 is selected, the dummy cell 58B connected to the bit line 52 is simultaneously selected. Consequently, if data "1" is stored in the selected memory cell 55A, a potential on the bit line 51 remains at the power-supply potential $V_{DD}$. On the contrary, if data "0" is stored in the selected memory cell 55A, the bit line 51 is discharged to a ground potential. On the other hand, respective conductances of the dummy cells 58A and 58B are set smaller than those of the memory cells 55A and 55B storing data "0" and larger than those of the memory cells 55A and 55B storing data "1". Thus, when the dummy cell 58B is selected, the bit line 52 is discharged. The change in potential on the bit line 52 becomes gentler than that appearing when data "0" is read out to the bit line 51. Consequently, a potential difference appears between the bit lines 51 and 52. This potential difference is differentially amplified by the differential amplifier circuit 59.

In this semiconductor memory device, since the current detecting type sense amplifier is not employed unlike the conventional flush EEPROM shown in FIGS. 1 and 2, the above described problems do not occur.

However, in the semiconductor memory device shown in FIG. 8, the respective conductances of the dummy cells 58A and 58B must be set to one-half of the respective conductances of the memory cells 55A and 55B. Such setting of parameters of the dummy cells 58A and 58B involves difficulty in manufacturing techniques.

Furthermore, in the semiconductor memory device shown in FIG. 8, one differential amplifier circuit 59 is provided for each pair of bit lines 51 and 52. Therefore, when a pitch between the bit lines is decreased as the semiconductor memory device is made finer and the integration density thereof is increased, a space becomes small in which the differential amplifier circuit 59 is arranged, so that the layout becomes difficult.

Additionally, in the semiconductor memory device shown in FIG. 8, the bit lines 51 and 52 are precharged to the power-supply potential $V_{DD}$ (about 5 V) before reading out data. Consequently, the power-supply potential $V_{DD}$ is applied to respective drains of the memory cells 55A and 55B, so that the potential difference between a floating gate storing electrons and the drains is increased. As a result, electrons are liable to be emitted from the floating gate to the drains by the tunnel phenomenon, whereby data holding characteristics of the memory cells 55A and 55B ar liable to be adversely affected.

SUMMARY OF THE INVENTION

An object of the present invention is to provide a semiconductor memory device in which a reading operation can be performed at high speed even if the integration density is increased.

Another object of the present invention is to provide a semiconductor memory device in which a reading operation of information is performed at high speed by differential amplification.

Still another object of the present invention is to provide a semiconductor memory device in which there is a sufficient space to form a sense amplifier even if a pitch between bit lines is decreased as a semiconductor memory device is made finer and the integration density thereof is increased.

A further object of the present invention is to provide a nonvolatile semiconductor memory device in which data holding characteristics of memory cells are not adversely affected at the time of reading out information.

A still further object of the present invention is to provide a nonvolatile semiconductor memory device in which a reading operation can be performed at high speed without difficulty in manufacturing techniques.

The semiconductor memory device according to the present invention comprises at least one first bit line pair comprising a first bit line and a second bit line, at least one second bit line pair comprising a third bit line and a fourth bit line, a plurality of memory cells, a first dummy cell, a second dummy cell, at least one differential amplifier means, memory cell selecting means, dummy cell selecting means, and switching means.

Each of the plurality of memory cells is connected to either one of bit lines in the first bit line pair or the second bit line pair. The first dummy cell is connected to either one of the bit lines in the first bit line pair. The second dummy cell is connected to either one of the bit lines in the second bit line pair. The differential amplifier means has first and second terminals, which differentially amplifies potentials of the first and second terminals.

The memory cell selecting means selects any of the plurality of memory cells. The dummy cell selecting means selects the second dummy cell when a memory cell connected to the first bit line pair is selected by the memory cell selecting means while selecting the first dummy cell when a memory cell connected to the second bit line pair is selected by the memory cell selecting means.

When the memory cell connected to the first bit line pair is selected by the memory cell selecting means, the switching means couples the first or second bit line connected to the selected memory cell to the first terminal of the corresponding differential amplifier means and couples the third and fourth bit lines to the second terminal of the corresponding differential amplifier means. In addition, when the memory cell connected to the second bit line pair is selected by the memory cell selecting means, the switching means couples the third or fourth bit line connected to the selected memory cell to the second terminal of the corresponding differential amplifier means and couples the first and second bit lines to the first terminal of the corresponding differential amplifier means.

In the semiconductor memory device according to the present invention, when the memory cell connected to the first or second bit line is selected, the second dummy cell connected to the third or fourth bit line is simultaneously selected. Information in the selected memory cell is read out onto a single bit line connected to the memory cell. Contrary to this, information in the second dummy cell is read out onto the third and fourth bit lines. More specifically, the load capacitance of a bit line connected to the second dummy cell on a non-selected side becomes twice that of a bit line connected to the selected memory cell on a selected side. As a result, the change in potential on the bit line on the non-selected side becomes one-half of the change in potential on the bit line on the selected side. Thus, the potential on the bit line on the non-selected side becomes an intermediate potential between a potential on the bit line to occur when information "1" is stored in the memory cell and a potential on the bit line to occur when information "0" is stored therein, to provide a reference level relative to the potential on the bit line on the selected side.

On the other hand, when the memory cell connected to the third or fourth bit line is selected, the first dummy cell connected to the first or second bit line is simultaneously selected. Consequently, the potentials on the first and second bit lines provide a reference level relative to the potential on the third or fourth bit line. Thus, the potential on the bit line on the selected side and the potential on the bit line on the non-selected side are differentially amplified, so that a reading operation is performed at high speed.

In accordance with another aspect of the present invention, the semiconductor memory device comprises at least one first bit line, at least one second bit line, a plurality of memory cells, reference potential generating means, a first dummy cell, a second dummy cell, memory cell selecting means, dummy cell selecting means, and at least one differential amplifier means.

Each of the plurality of memory cells is coupled between the first or second bit line and a predetermined power-supply potential. The memory cell is set to be rendered conductive when it is selected or set to be rendered non-conductive when it is selected. The reference potential generating means generates a reference potential which is an intermediate potential of a predetermined potential. The first dummy cell is coupled between the first bit line and the reference potential generating means, which is rendered conductive when it is selected. The second dummy cell is coupled between the second bit line and the reference potential generating means, which is rendered conductive when it is selected.

The memory cell selecting means selects any of the plurality of memory cells. The dummy cell selecting means selects the second dummy cell when a memory cell coupled to the first bit line is selected by the memory cell selecting means while selecting the first dummy cell when a memory cell coupled to the second bit line is selected by the memory cell selecting means. The differential amplifier means has a first terminal coupled to the first bit line and a second terminal coupled to the second bit line, which differentially amplifies potentials of the first and second terminals.

In the above described semiconductor memory device, when the memory cell connected to the first bit line is selected, the second dummy cell connected to the second bit line is simultaneously selected. A potential on the first bit line is not changed or is changed to a predetermined potential depending on information stored in the selected memory cell. The potential on the second bit line is changed to a reference potential which is an intermediate potential of a predetermined potential through the second dummy cell. Consequently, the potential on the second bit line provides a reference level relative to the potential on the first bit line. On the contrary, when the memory cell connected to the second bit line is selected, the first dummy cell connected to the first bit line is simultaneously selected. Consequently, the potential on the second bit line is not changed or is changed to a predetermined potential depending on information stored in the selected memory cell. On the other hand, the potential on the first bit line is changed to a reference potential which is an intermediate potential of a predetermined potential through the first dummy cell. Thus, the potential on the first bit line provides a reference level relative to the potential on the second bit line. As a result, the respective potentials on the first and second bit lines are differentially amplified, so that a reading operation is performed at high speed.

As described in the foregoing, according to the present invention, since the reference level relative to a potential on a bit line to which information stored in the selected memory cell is read out is provided by another bit lines and potentials on the bit lines are differentially amplified, the reading operation can be performed at high speed even if the integration density is increased.

Additionally, since information as read out are held in differential amplifier means, a high-speed reading operation such as a reading operation in a page mode can be performed.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram showing a circuit structure of a memory cell array shown in FIG. 1;

FIG. 3 is a cross sectional view showing a memory transistor constituting a memory cell;

FIG. 4 is a diagram showing an equivalent circuit of the memory transistor shown in FIG. 3;

DESCRIPTION OF THE PREFERRED EMBODIMENTS

Figure 1:
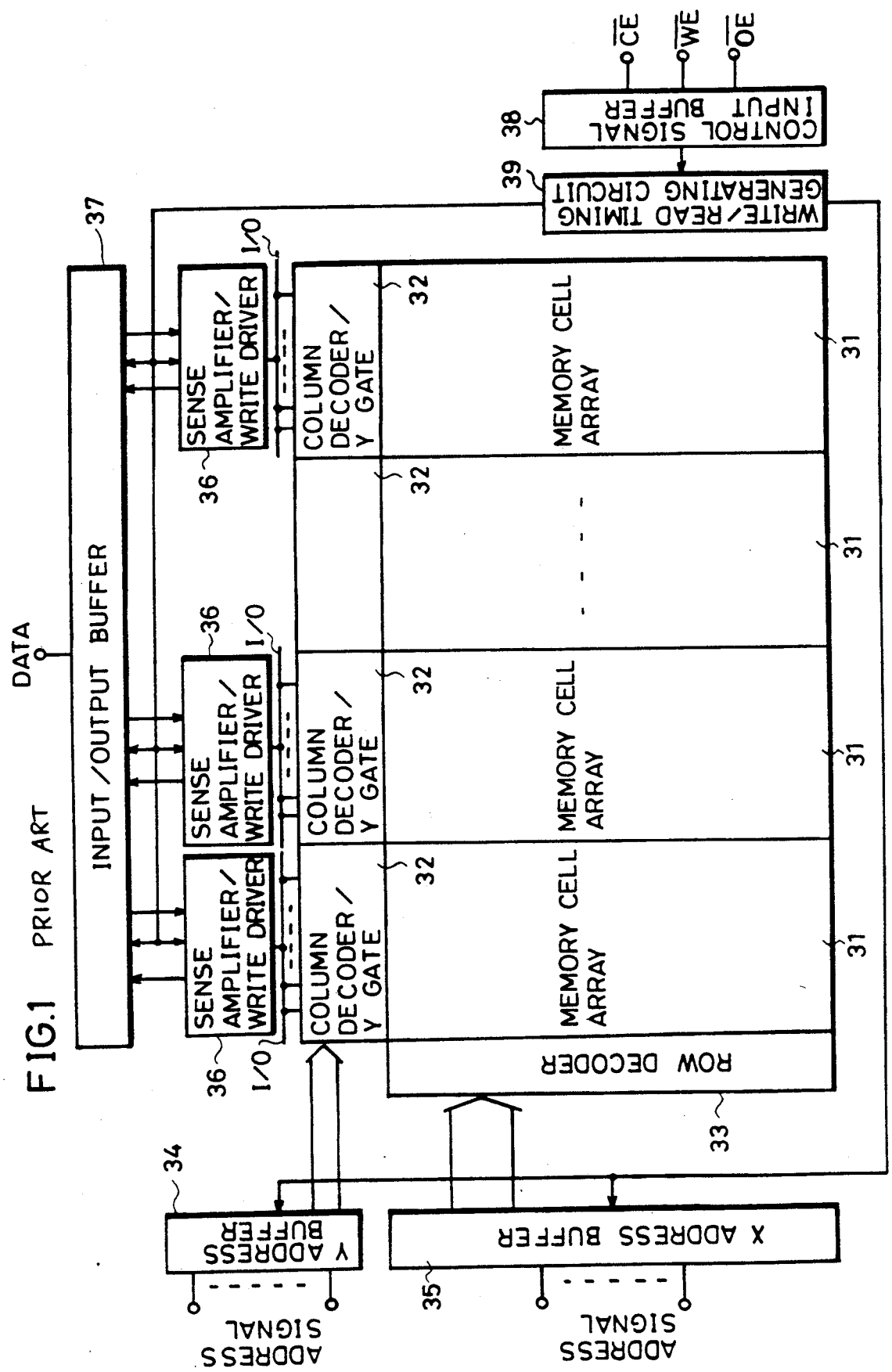
FIG. 1 is a block diagram showing the entire structure of a conventional flush EEPROM.
Figure 5A:
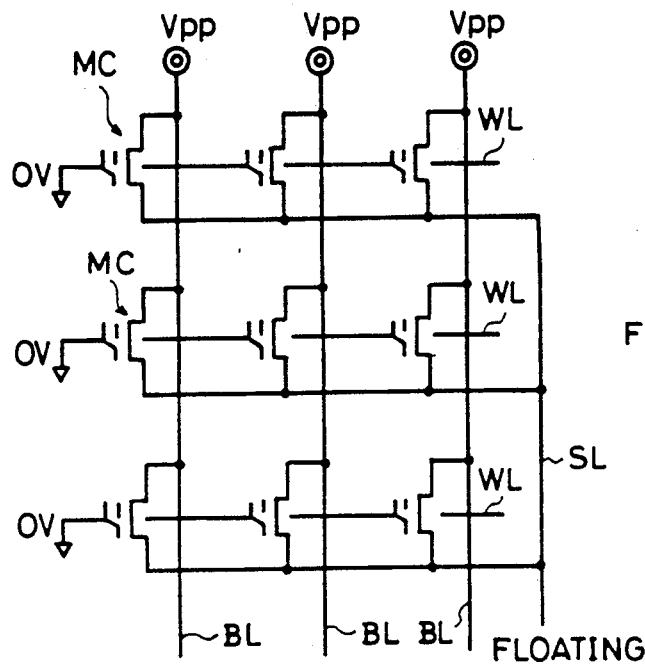
FIG. 5A is a diagram for explaining an erasing operation of a flush EEPROM.
Figure 5B:
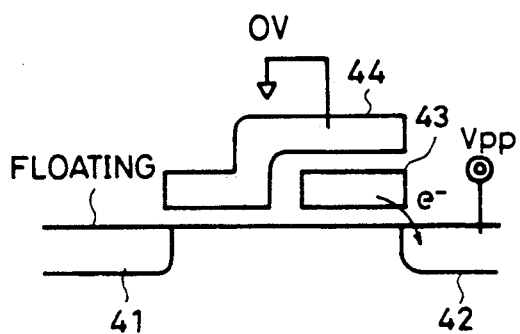
FIG. 5B is a cross sectional view for explaining an erasing operation of the memory transistor.
Figure 6A:
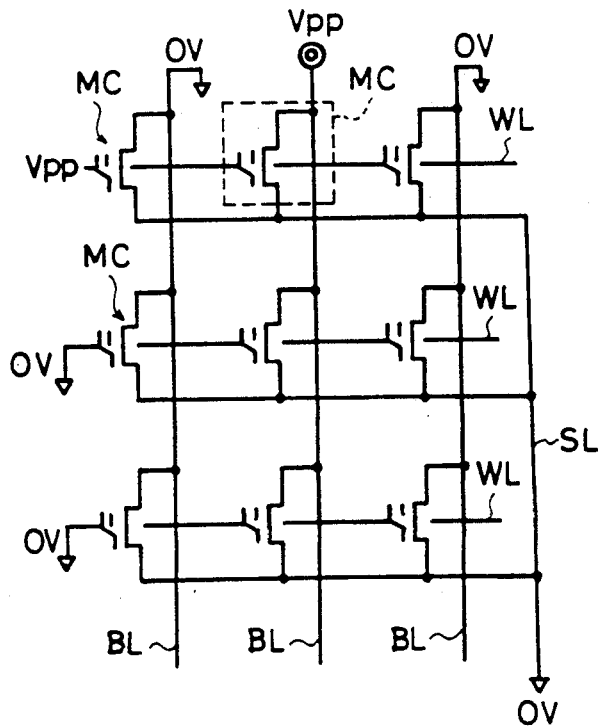
FIG. 6A is a diagram for explaining a writing operation of the flush EEPROM.
Figure 6B:
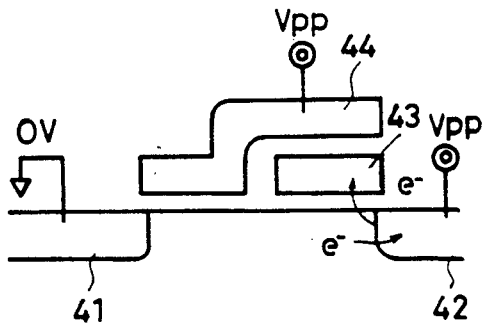
FIG. 6B is a cross sectional view for explaining a writing operation of the memory transistor.
Figure 7:
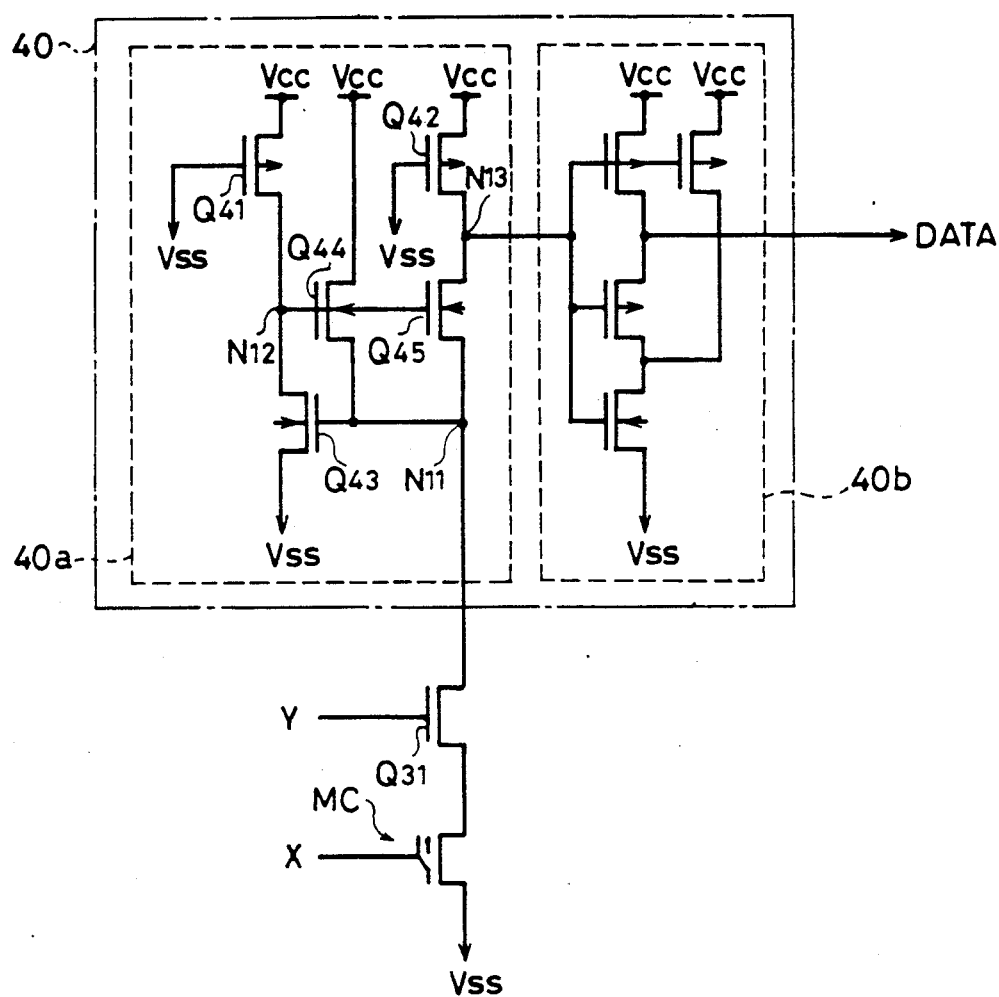
FIG. 7 is a diagram showing a circuit structure of a current detecting type sense amplifier.
Figure 8:
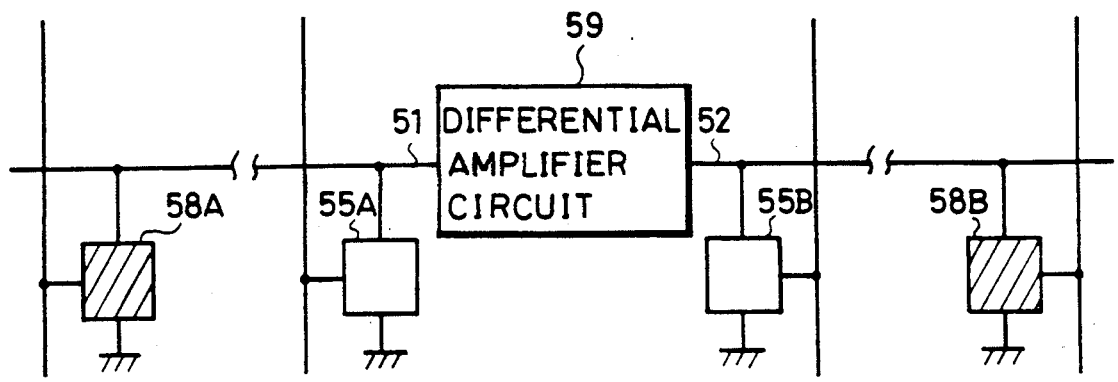
FIG. 8 is a diagram showing another example of the conventional semiconductor memory device.

Referring now to the drawings, the embodiments of the present invention will be described.

Figure 9:
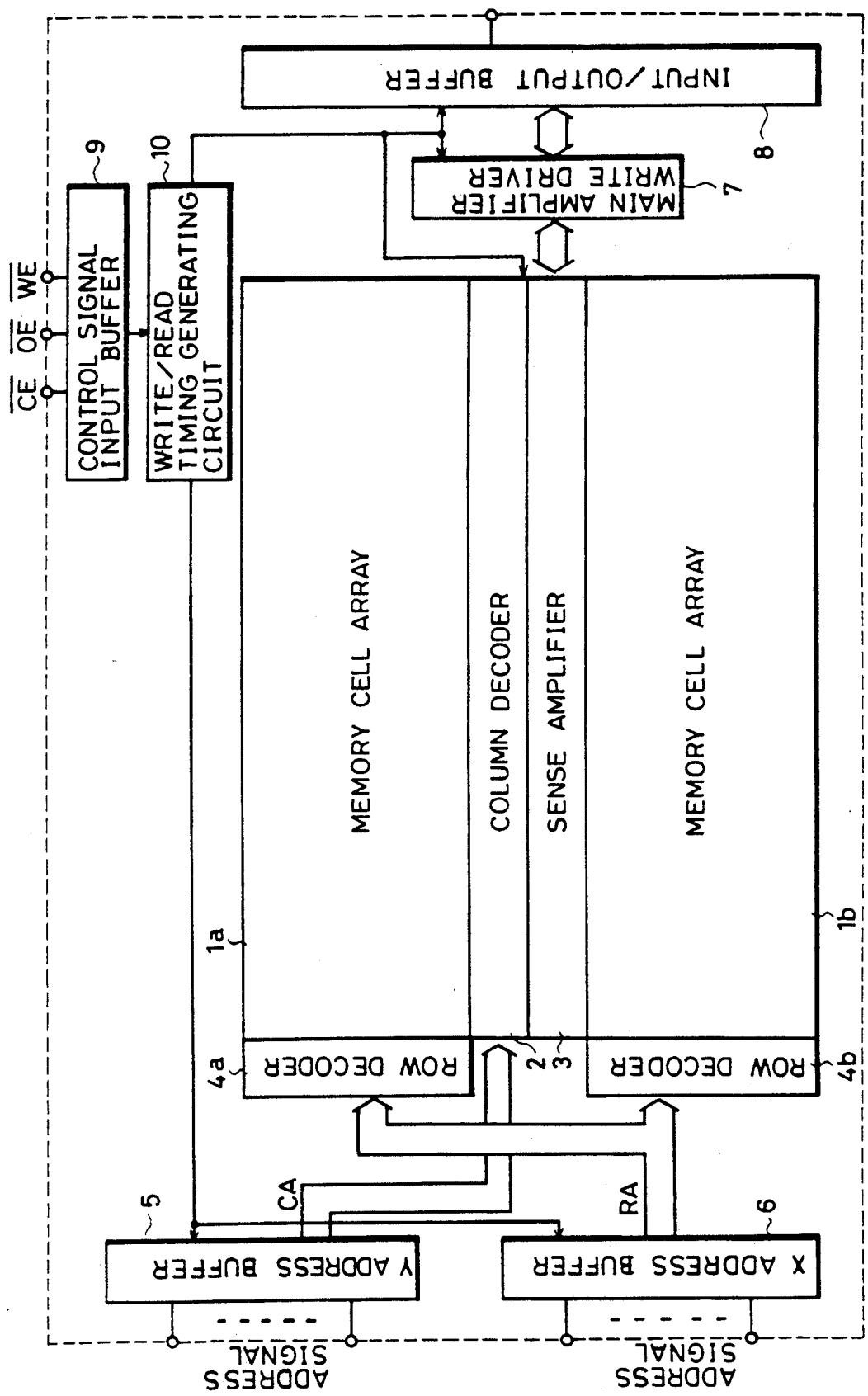
FIG. 9 is a block diagram showing the entire structure of a flush EEPROM according to one embodiment of the present invention.

FIG. 9 is a block diagram showing the entire structure of a flush EEPROM according to one embodiment of the present invention.

A flush EEPROM shown in FIG. 9 includes memory cell arrays (blocks) 1a and 1b. A column decoder 2 and a sense amplifier 3 are arranged between the memory cell arrays 1a and 1b. In addition, row decoders 4a and 4b are connected to the memory cell arrays 1a and 1b, respectively. A Y address buffer 5 applies to the column decoder 2 an address signal externally applied as a column address signal CA. An X address buffer 6 applies to the row decoders 4a and 4b an address signal externally applied as a row address signal RA. Each of the memory cell arrays 1a and 1b comprises a plurality of memory cells arranged in a plurality of rows and columns, as described below. The row decoders 4a and 4b are responsive to the row address signal RA for selecting one row in the memory cell arrays 1a and 1b. The column decoder 2 is responsive to the column address signal CA for selecting one column in the memory cell arrays 1a and 1b. In the above described manner, one memory cell in the memory cell arrays 1a and 1b is selected. At the time of a reading operation, data in the selected memory cell is amplified by the sense amplifier 3, to be outputted to the exterior through a main amplifier/write driver 7 and an input/output buffer 8. At the time of a writing operation, data externally applied is written to the selected memory cell through the input/output buffer 8 and the main amplifier/write driver 7.

On the other hand, a chip enable signal $\overline{CE}$, an output enable signal $\overline{OE}$ and a write enable signal $\overline{WE}$ are externally applied to a control signal input buffer 9. The control signal input buffer 9 is responsive to the control signals for applying control signals to a write/read timing generating circuit 10. The write/read timing generating circuit 10 is responsive to the control signals for generating various timing signals required for the writing operation and the reading operation.

Figure 10:
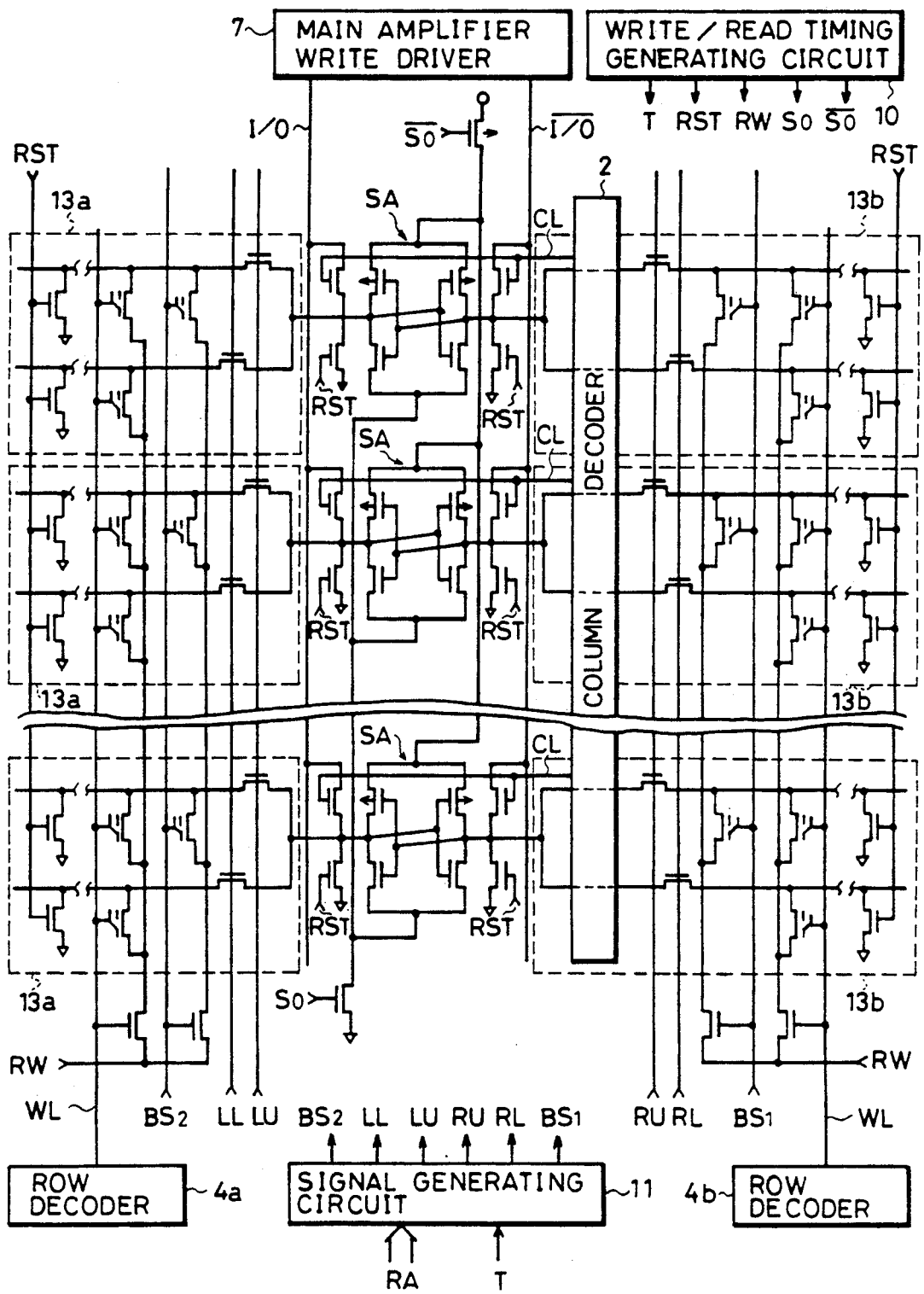
FIG. 10 is a diagram showing a circuit structure of a memory cell array shown in FIG. 9.

FIG. 10 is a diagram showing a circuit structure of the memory cell arrays 1a and 1b shown in FIG. 9.

In FIG. 10, two I/O lines I/O and $\overline{I/O}$ are arranged in the central portion. A plurality of sense amplifiers SA of a flip-flop type are arranged between the I/O lines I/O and $\overline{I/O}$. In addition, a plurality of columns 13a and 13b are arranged corresponding to the plurality of the sense amplifiers SA. Furthermore, a plurality of word lines WL are arranged intersecting with the plurality of columns 13a and 13b. In FIG. 10, only a single word line WL intersecting with the columns 13a on the left and only a single word line WL intersecting with the columns 13b on the right are illustrated and other word lines WL are omitted. A plurality of word lines WL arranged on the left of the I/O lines I/O and $\overline{I/O}$ are connected to a row decoder 4a. A plurality of word lines WL arranged on the right of the I/O lines I/O and $\overline{I/O}$ are connected to a row decoder 4b.

The row decoders 4a and 4b are responsive to the row address signal RA applied from the X address buffer 6 (in FIG. 9) for selecting one of the plurality of word lines WL and raising a potential thereon to an "H" level. On the other hand, a column decoder 2 has a plurality of output terminals CL corresponding to the plurality of sense amplifiers SA. The column decoder 2 is responsive to the column address signal CA applied from the Y address buffer 5 (in FIG. 9) for selecting one of the plurality of sense amplifiers SA and connecting the sense amplifier SA to the I/O lines I/O and I/O. The I/O lines I/O and I/O are connected to a main amplifier/write driver 7.

On the other hand, a write/read timing generating circuit 10 generates a timing signal T, a reset signal RST, a read signal RW, and sense amplifier activating signals $S_0$ and $\overline{S_0}$. A signal generating circuit 11 is responsive to the row address signal RA applied from the X address buffer 6 and the timing signal T applied from the write/read timing generating circuit 10 for generating block selecting signals BS1 and BS2 and switching signals LL, LU, RU and RL.

Figure 11:
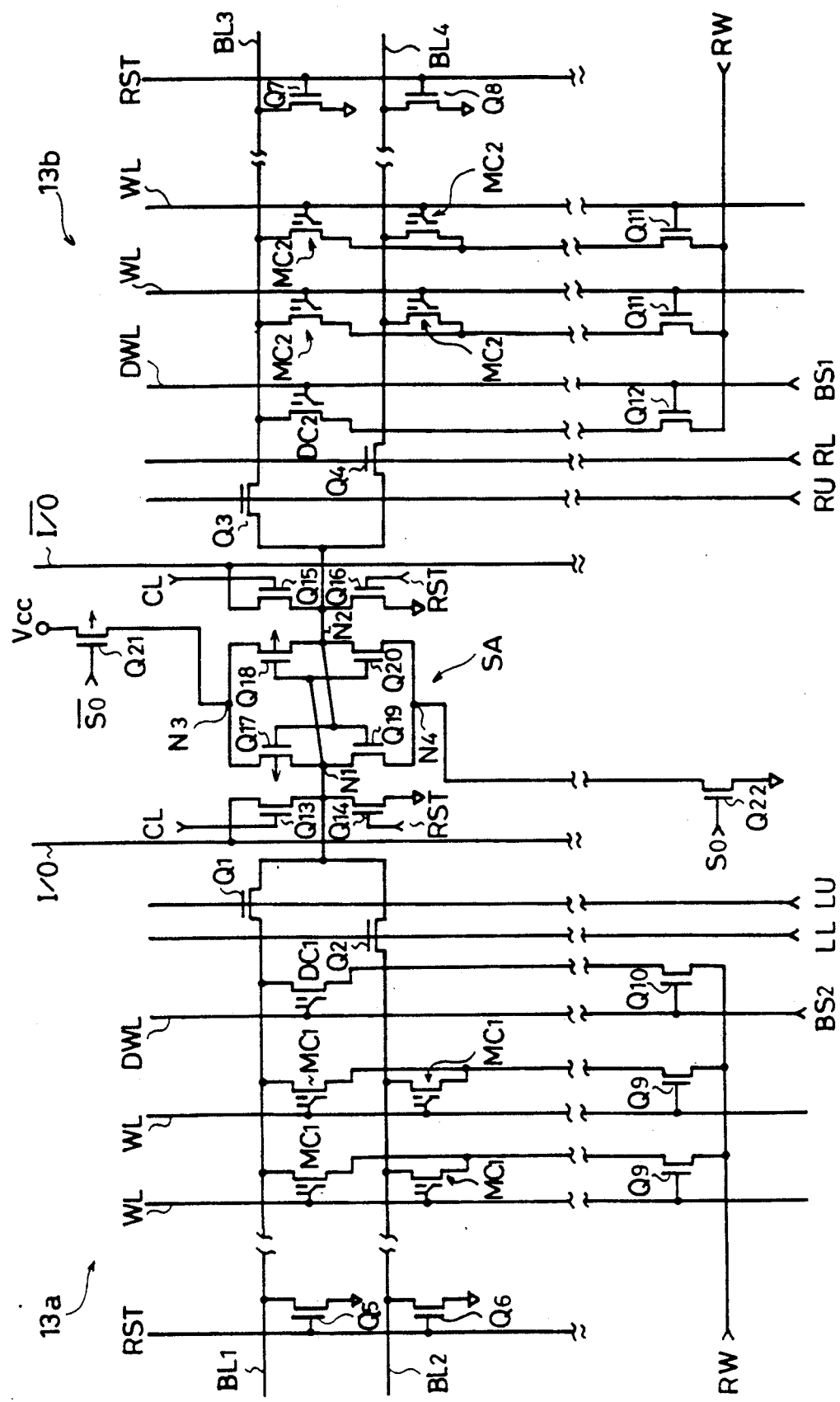
FIG. 11 is a diagram showing a circuit structure of one sense amplifier and one pair of columns shown in FIG. 10.

FIG. 11 is a circuit diagram showing one sense amplifier SA and one pair of columns 13a and 13b arranged on both sides thereof as shown in FIG. 10.

In FIG. 11, two bit lines BL1 and BL2 are arranged on the left of the sense amplifier SA, and two bit lines BL3 and BL4 are arranged on the right thereof. The bit lines BL1 and BL2 are connected to a node N1 of the sense amplifier SA through N channel MOS transistors Q1 and Q2, respectively. The bit lines BL3 and BL4 are connected to a node N2 of the sense amplifier SA through N channel MOS transistors Q3 and Q4, respectively. The transistors Q1, Q2, Q3 and Q4 have their gates receiving switching signals LU, LL, RU and RL, respectively. A plurality of word lines WL and one dummy word line DWL are arranged intersecting with the bit lines BL1 and BL2. In addition, a plurality of word lines WL and one dummy word line DWL are arranged intersecting with the bit lines BL3 and BL4.

Memory cells MC1 are provided at intersections of the bit lines BL1 and BL2 and the plurality of word lines WL, respectively. Each of the memory cells MC1 has its control gate connected to a corresponding word line WL and its drain connected to a corresponding bit line BL1 or BL2. In addition, each of the memory cells MC1 has its source receiving a signal RW through an N channel MOS transistor Q9. The transistor Q9 has its gate connected to a corresponding word line WL. Furthermore, a dummy cell DC1 is provided at an intersection of the bit line BL1 and the dummy word line DWL. The dummy cell DC1 has its control gate connected to the dummy word line DWL and its drain connected to the bit line BL1. In addition, the dummy cell DC1 has its source receiving the signal RW through an N channel MOS transistor Q10. The transistor Q10 has its gate connected to the dummy word line DWL. A block selecting signal BS2 is applied to the dummy word line DWL.

Similarly, memory cells MC2 are provided at intersections of the bit lines BL3 and BL4 and the plurality of word lines WL, respectively. Each of the memory cells MC2 has its control gate connected to a corresponding word line WL and its drain connected to a corresponding bit line BL3 or BL4. In addition, each of the memory cells MC2 has its source receiving a signal RW through an N channel MOS transistor Q11. The transistor Q11 has its gate connected to a corresponding word line WL. Furthermore, a dummy cell DC2 is provided at an intersection of the bit line BL3 and the dummy word line DWL. The dummy cell DC2 has its control gate connected to the dummy word line DWL and its drain connected to the bit line BL3. In addition, the dummy cell DC2 has its source receiving the signal RW through an N channel MOS transistor Q12. The transistor Q12 has its gate connected to the dummy word line DWL. A block selecting signal BS1 is applied to the dummy word line DWL.

On the other hand, N channel MOS transistors Q5, Q6, Q7 and Q8 are connected between the bit lines BL1, BL2, BL3 and BL4 and a ground potential, respectively. The N channel MOS transistors Q5, Q6, Q7 and Q8 have their gates receiving a reset signal RST.

The sense amplifier SA comprises P channel MOS transistors Q17 and Q18 and N channel MOS transistors Q19 and Q20. The transistor Q17 is connected between the node N1 and a node N3, and the transistor Q19 is connected between the node N1 and a node N4. The transistors Q17 and Q19 have their gates connected to the node N2. The transistor Q18 is connected between the nodes N2 and N3, and the transistor Q20 is connected between the nodes N2 and N4. The transistors Q18 and Q20 have their gates connected to the node N1. In addition, the node N3 is coupled to a power-supply potential $V_{CC}$ through a P channel MOS transistor Q21. The node N4 is coupled to a ground potential through an N channel MOS transistor Q22. The transistor Q21 has its gate receiving a sense amplifier activating signal $S_0$. The transistor Q22 has its gate receiving a sense amplifier activating signal $\overline{S_0}$.

When the sense amplifier activating signal $S_0$ attains the "H" level and the sense amplifier activating signal $\overline{S_0}$ attains the "L" level, the sense amplifier SA is activated. The sense amplifier SA raises the higher potential out of potentials of the nodes N1 and N2 to the power-supply potential $V_{CC}$ while lowering the lower potential to a ground potential.

The node N1 of the sense amplifier SA is connected to an I/O line I/O through an MOS transistor Q13 and connected to ground through an N channel MOS transistor Q14. In addition, the node N2 of the sense amplifier SA is connected to an I/O line $\overline{I/O}$ through an N channel MOS transistor Q15 and conencted to ground through an N channel MOS transistor Q16. The transistors Q13 and Q25 have their gates receiving an output signal from the column decoder 2 (in FIG. 10). The transistors Q14 and Q16 have their gates receiving a reset signal RST.

Figure 12:
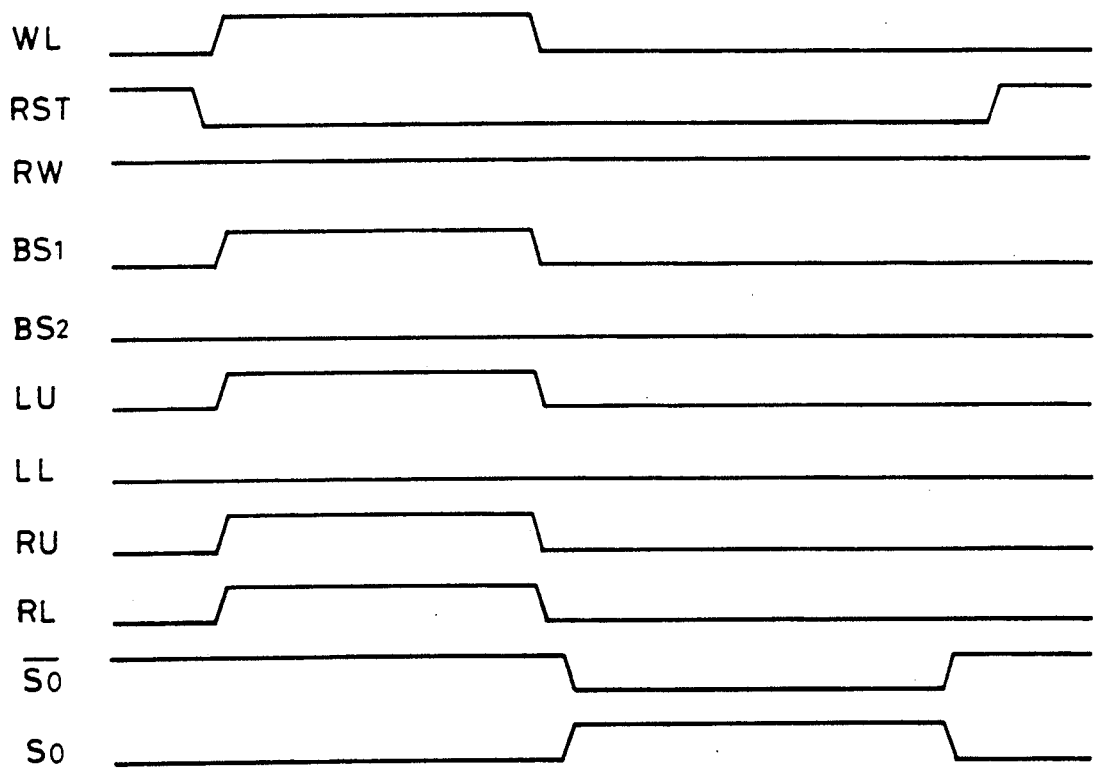
FIG. 12 is a timing chart for explaining a reading operation according to the embodiment shown in FIGS. 9 to 11.

Meanwhile, the structures of the memory cells MC1 and MC2 and the dummy cells DC1 and DC2 are the same as those shown in FIGS. 3 and 4. In addition, the dummy cells DC1 and DC2 are kept in an erased state (conductive state). Referring now to a timing chart of FIG. 12, description is made on a reading operation according to the present embodiment. First, the reset signal RST attains the "H" level. Consequently, the transistors Q5 to Q8, Q14 and Q16 are turned on, so that the bit lines BL1 to BL4 and the nodes N1 and N2 are grounded. The signal RW is kept at the power-supply potential $V_{CC}$ (5 V). Thereafter, the reset signal RST falls to the "L" level. The row decoders 4a and 4b select a single word line WL and raises a potential thereon to the "H" level. It is assumed that the memory cell MC1 connected to the bit line BL1 is selected. In this case, the potential on the word line WL is raised to the "H" level and at the same time, the block selecting signal BS1 rises to the "H" level. Consequently, the dummy cell DC2 is selected. In addition, on this occasion, the switching signal LU rises to the "H" level and the switching signals RU and RL rise to the "H" level. Consequently, the bit line BL1 is connected to the node N1 of the sense amplifier SA, and the bit lines BL3 and BL4 are connected to the node N2.

When the selected memory cell MC1 is in the erased state, the threshold voltage thereof is low, so that the memory cell MC1 is rendered conductive. Therefore, the bit line BL1 is charged by the signal RW through the transistor Q9 and the memory cell MC1. On the other hand, when the selected memory cell MC1 is in a written state, the threshold voltage thereof is high, so that the memory cell MC1 is rendered non-conductive. Therefore, the bit line BL1 remains at a ground potential (0 V).

On the other hand, since the dummy cell DC2 is in the erased state, the threshold voltage thereof is low, so that the dummy cell DC2 is rendered conductive. On this occasion, since the transistors Q3 and Q4 are both turned on, the bit lines BL3 and BL4 are charged by the signal RW through the transistor Q12 and the dummy cell DC2. However, since the two bit lines BL3 and BL4 are connected to the dummy cell DC2, the rise in potential of the node N2 is delayed, as compared with the rise in potential of the node N1 to occur when the selected memory cell MC1 is in the erased state. More specifically, the potential of the node N2 becomes an approximately intermediate potential between the potential of the node N1 to occur when the memory cell MC1 is in the erased state and the potential of the node N1 when the memory cell MC1 is in the written state. Thus, the potential of the node N2 becomes a reference level relative to the potential of the node N1.

Thereafter, the potential on the word line WL is lowered to the "L" level and the block selecting signal BS1 and switching signals LU, RU and RL fall to the "L" level. Consequently, the bit line BL1 is separated from the node N1, and the bit lines BL3 and BL4 are separated from the node N2. The sense amplifier activating signal $\bar{S}_0$ falls to the "L" level, and the sense amplifier activating signal $S_0$ rises to the "H" level. Consequently, the sense amplifier SA is operated. More specifically, the potential of the node N1 is compared with the potential of the node N2. The higher potential thereof is raised to the pow'ar-supply potential $V_{CC}$ and the lower potential thereof is lowered to the ground potential. Thereafter, when an "H" level signal is applied to the gates of the transistors Q13 and Q15 by the column decoder 2, the potentials of the nodes N1 and N2 are read out to the I/O lines I/O and $\overline{I/O}$, respectively.

When the memory cell MC1 connected to the bit line BL2 is selected, the switching signal LL attains the "H" level and the switching signal LU remains at the "L" level. The other operations are the same as that when the memory cell MC1 connected to the first bit line BL1 is selected.

On the other hand, the memory cell MC2 connected to the bit line BL3 is selected, the potential on the word line WL is raised to the "H" level and at the same time, the block selecting signal BS2 rises to the "H" level. Consequently, the dummy cell DC1 is selected. In addition, on this occasion, the switching signal RU rises to the "H" level and the switching signals LL and LU rise to the "H" level. Consequently, the bit line BL3 is connected to the node N2 of the sense amplifier SA and the bit lines BL1 and BL2 are connected to the node N1 of the sense amplifier SA. As a result, the bit lines BL1 and BL2 are charged by the read signal RW through the transistor Q10 and the dummy cell DC1. Thus, the potential of the node N1 becomes a reference level relative to the potential of the node N2.

Additionally, when the memory cell MC2 connected to the bit line BL4, the switching signal RL attains the "H" level and the switching signal RU remains at the "L" level. Thus, the bit line BL4 is connected to the node N2 of the sense amplifier SA and the bit lines BL1 and BL2 are connected to the node N1 of the sense amplifier SA. Other operations are the same as that to occur when the memory cell MC2 connected to the bit line BL3 is selected.

Figure 13:
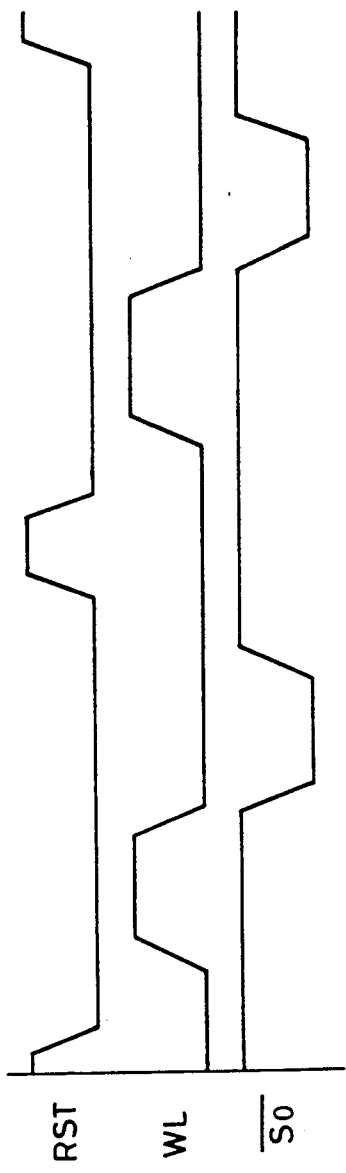
FIG. 13 is a diagram showing the changes in potential on bit lines and the changes in potential of nodes of a sense amplifier in the reading operation.
Figure 13:
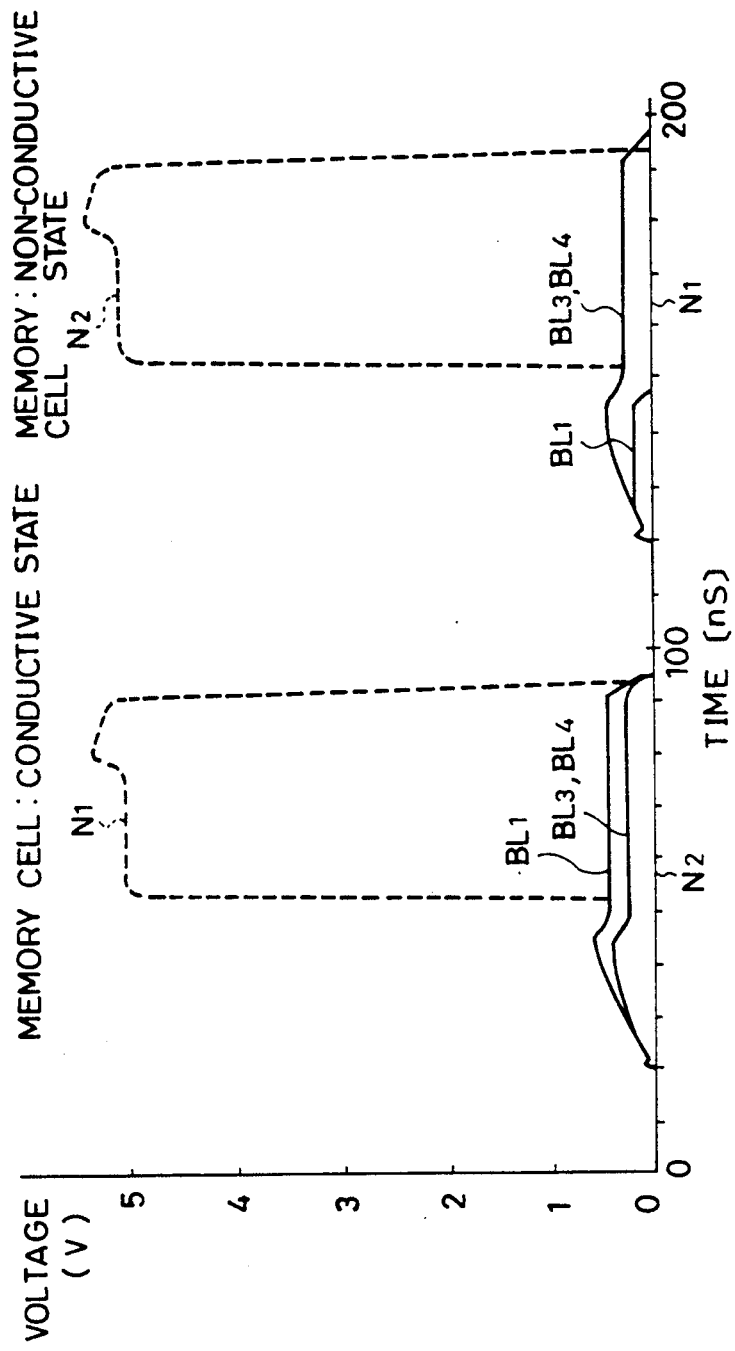

FIG. 13 is a diagram showing the change in the reset signal, the potential on the w'ord line and the sense amplifier activating signal in the reading operation and the change in the potentials on the bit lines and the potentials on the nodes N1 and N2.

FIG. 13 shows a case in which the memory cell MC1 connected to the bit line BL1 is selected. Description is now made on a case in which the selected memory cell MC1 is in the conductive state, i.e., the erased state. First, when the reset signal RST falls to the "L" level, the potentials on the bit lines BL1 to BL4 and the potentials of the nodes N1 and N2 become 0V. Thereafter, when the potential on the word line WL is raised to the "H" level, the potential on the bit line BL1 is raised and the potential of the node N1 is raised because the memory cell MC1 is in the conductive state. On this occasion, the bit lines BL3 and BL4 are charged through the dummy cell DC2, so that the potentials thereon are raised more gradually than the potential on the bit line BL1. Correspondingly, the potential of the node N2 is raised. When the potential on the bit line BL1 is raised to approximately 0.5 V, the potential on the word line WL is lowered to the "L" level. On this occasion, the bit line BL1 is separated from the node N1 and the bit lines BL3 and BL4 are separated from the node N2. Thus, the potentials on the bit lines BL1, BL3 and BL4 are not further raised. Thereafter, the sense amplifier activating signal $\bar{S}_0$ falls to the "L" level, so that the sense amplifier SA is activated. Consequently, the potential of the node N1 is raised to approximately 5 V and the potential of the node N2 is lowered to 0 V.

Description is now made on a case in which the selected memory cell MC1 is in the non-conductive state, i.e., in the written state. In this state, when the potential on the word line WL is raised to the "H" level, the potential on the bit line BL1 is hardly raised and the potential of the node N1 is not raised because the memory cell MC1 is non-conductive. On this occasion, since the bit lines BL3 and BL4 are charged through the dummy cell DC2, potentials thereon are raised gradually. Correspondingly, the potential of the node N2 is raised. When the potential on the word line WL is lowered to the "L" level, the bit line BL1 is separated from the node N1 and the bit lines BL3 and BL4 are separated from the node N2. Thus, the potentials on the bit lines BL1, BL3 and BL4 are not further changed. Thereafter, when the sense amplifier activating signal $\bar{S}_0$ falls to the "L" level, the sense amplifier SA is activated. Consequently, the potential of the node N1 is lowered to 0 V and the potential of the node N2 is raised to 5 V.

Thus, in the flush EEPROM according to the present embodiment, the potential read out from the selected memory cell and the reference potential are differentially amplified, so that the reading operation of data is speeded up.

In addition, since the memory cells MC1 and MC2 and the dummy cells DC1 and DC2 have the same structure, difficulties in manufacturing techniques are not encountered.

Furthermore, since the potential on the bit line is only raised to approximately 0.5 V, a voltage of 0.5 V or more is not applied to the drains of the memory cells MC1 and MC2. Thus, data holding characteristics of the memory cells MC1 and MC2 are not adversely affected.

Additionally, each of the sense amplifiers SA is provided every four bit lines BL1 to BL4. Thus, even if a pitch between the bit lines is decreased as the semiconductor memory device is made finer and the integration density thereof is increased, there are sufficient spaces to form the sense amplifiers SA. In FIG. 10, when one word line WL is selected by the row decoders 4a and 4b, data are read out from the plurality of memory cells MC1 or MC2 connected to the word line WL, so that the plurality of data are held in corresponding sense amplifiers SA, respectively. Thus, if outputs of the column decoder 2 are sequentially changed, data held in the plurality of sense amplifiers SA are sequentially read out at high speed. More specifically, reading in a page mode in a dynamic random access memory becomes possible.

Although in the above described embodiment, the bit lines BL1 to BL4 and the sense amplifier SA are provided with the transistors Q5 to Q8, Q14 and Q16 for resetting, any of the transistors Q5 to Q8 on the side of the bit lines or the transistors Q14 and Q16 on the side of the sense amplifier may be omitted providing that the switching signals LU, LL, RU and RL are brought to the "H" level at the time of resetting.

Figure 14:
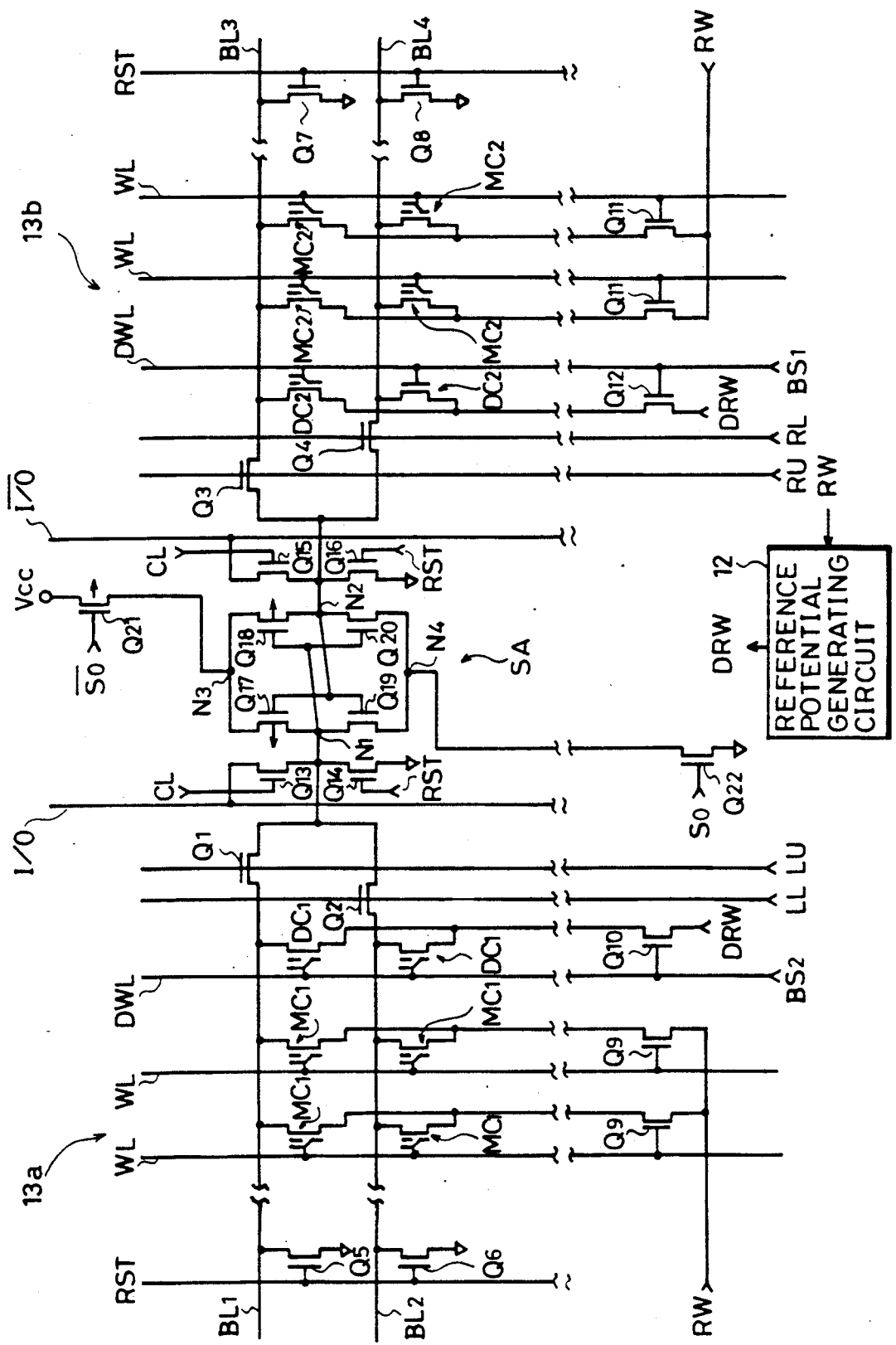
FIG. 14 is a diagram showing a circuit structure of main portions of a flush EEPROM according to another embodiment of the present invention.

FIG. 14 is a circuit diagram showing a structure of the flush EEPROM according to another embodiment of the present invention.

The EEPROM according to the present embodiment is the same as the EEPROM according to the embodiment shown in FIG. 11 except for the following. In the present embodiment, dummy cells DC1 are connected to an intersection of a bit line BL1 and a dummy word line DWL as well as an intersection of a bit line BL2 and the dummy word line DWL. In addition, dummy cells DC2 are connected to an intersection of a bit line BL3 and a dummy word line DWL as well as an intersection of a bit line BL4 and the dummy word line DWL. Furthermore, the dummy cells DC1 have their sources receiving a reference potential DRW through a transistor Q10. In addition, the dummy cells DC2 have their sources receiving a reference potential DRW through a transistor Q12. The reference potential DRW is an intermediate potential (for example, 2.5 V) between a power-supply potential and a ground potential, which is generated from a reference potential generating circuit 12.

In a reading operation of the EEPROM according to the present embodiment, when the memory cell MC1 connected to the bit line BL1, for example, is selected, a switching signal LU attains an "H" level, so that the bit line BL1 is connected to a node N1. At the same time, either one of the switching signals RU and RL attains the "H" level, so that either one of the bit lines BL3 and BL4 is connected to a node N2. In this case, the bit line BL3 or BL4 connected to the node N2 is charged by a reference potential DRW through the dummy cells DC2. Thus, a potential of the node N2 becomes an almost intermediate potential between a potential of the node N1 when the selected memory cell MC1 is in an erased state and a potential of the node N1 when the selected memory cell MC1 is in a written state. More specifically, the potential of the node N2 becomes a reference level relative to the potential of the node N1.

Also in the present embodiment, the memory cells MC1 and MC2 and the dummy cells DC1 and DC2 have the same structure, so that the semiconductor memory device can be manufactured by a simple manufacturing process. In addition, sense amplifiers SA are provided every adjacent two bit lines. Thus, even if a pitch between the bit lines is decreased as the semiconductor memory device is made finer and the integration density is increased, there is a sufficient space to form the sense amplifiers.

Meanwhile, in the embodiment shown in FIG. 14, either one of the bit lines BL1 and BL2 may be provided with the dummy cell DC1 and either one of the bit lines BL3 and BL4 may be provided with the dummy cell DC2, as in the embodiment shown in FIG. 11. In this case, when the memory cell MC1 connected to the bit line BL1 or BL2 is selected, only the bit line BL3 or BL4 connected to the dummy cell DC2 is connected to the node N2. In addition, when the memory cell MC2 connected to the bit line BL3 or BL4 is selected, only the bit line BL1 or BL2 connected to the dummy cell DC1 is connected to the node N1.

Additionally, although in the embodiment shown in FIG. 14, two bit lines are connected to the node N1 of each of the sense amplifiers SA and two bit lines are connected to the node N2 thereof, respective one bit lines may be connected to the nodes N1 and N2 of each of the sense amplifiers SA. However, the structure according to the embodiment shown in FIG. 14 takes up more space for forming the sense amplifiers SA.

Although in the above described embodiments shown in FIGS. 11 and 14, the signal RW is applied to sources of the memory cells MC1 and MC2 through transistors Q9 and Q11, respectively, the signal RW may be directly applied to respective sources of the memory cells MC1 and MC2.

Additionally, although in the above described embodiments, description was made on the flush EEPROM, it should be noted that the present invention is not limited to the same. For example, the present invention can be also applied to the other semiconductor memory devices such as an ordinary two-transistor type EEPROM, an EPROM and the other ROMs.

Meanwhile, an erasing operation and a writing operation of the flush EEPROM according to the above described embodiment one performed in the same manner as those shown in FIGS. 5A, 5B, 6A and 6B.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device in which information are read out by differential amplification, comprising:
   at least one first bit line pair comprising a first bit line and a second bit line,
   at least one second bit line pair comprising a third bit line and a fourth bit line,
   a plurality of memory cells each connected to either one of bit lines in said first bit line pair or said second bit line pair,
   a first dummy cell connected to either one of the bit lines in said first bit line pair,
   a second dummy cell connected to either one of the bit lines in said second bit line pair,
   at least one differential amplifier means having a first terminal and a second terminal for differentially amplifying a potential of said first terminal and a potential of said second terminal,
   memory cell selecting means for selecting any of said plurality of memory cells,
   dummy cell selecting means for selecting said second dummy cell when a memory cell connected to said first bit line pair is selected by said memory cell selecting means while selecting said first dummy cell when a memory cell connected to said second bit line pair is selected by said memory cell selecting means, and
   swiching means for coupling said first or second bit line connected to a memory cell connected to said first bit line pair to the first terminal of said corresponding differential amplifier means and coupling said third and fourth bit lines to the second terminal of said corresponding differential amplifier means when the memory cell connected to said first bit line pair is selected by said memory cell selecting means, while coupling said third or fourth bit line connected toa memory cell connected to said second bit line pair to the second terminal of said corresponding differential amplifier means and coupling said first and second bit liens to the first terminal of said corresponding differential amplifier means when the memory cell connected to second bit line pair is selected by said memory cell selecting means.

2. The semiconductor memory device according to claim 1, wherein each of said plurality of memory cells, said first dummy cell and said second dummy cell have the same structure.

3. A semiconductor memory device in which information are read out by differential amplification, comprising:
- at least one first bit line pair comprising a first bit line and a second bit line,
- at least one second bit line pair comprising a third bit line and a fourth bit line,
- a plurality of memory cells each connected to either one of bit lines in said first bit line pair or said second bit line pair,
- a first dummy cell connected to either one of the bit lines in said first bit line pair,
- a second dummy cell connected to either one of the bit lines in said second bit line pair,
- at least one differential amplifier means having a first terminal and a second terminal for differentially amplifying a potential of said first terminal and a potential of said second terminal,
- memory cell selecting means for selecting any of said plurality of memory cells,
- dummy cell selecting means for selecting said second dummy cell when a memory cell connected to said first bit line pair is selected by said memory cell selecting means while selecting said first dummy cell when a memory cell connected to said second bit line pair is selected by said memory cell selecting means, and
- switching means for coupling said first or second bit line connected to a memory cell connected to said first bit line pair to the first temrinal of said corresponding differential amplifier means and coupling said third and fourth bit lines to the second temrinal of said corresponding differential amplifier means when the memory cell connected to said first bit line pair is selected by said memory cell selecting means, while coupling said third or fourth bit line connected to a memory cell connected to said second bit line pair to the second temrinal of said corresponding differential amplifier means and coupling said first and second bit lines to the first terminal of said corresponding differential amplifier means when the memory cell connected to second bit line pair is selected by said memory cell selecting means,
- wherein each of said plurality of memory cells, said first dummy cell and said second dummy cell comprise a nonvolatile memory cell.

4. The semiconductor memory device according to claim 3, wherein
- each of said plurality of memory cells comprises a control gate receiving an output of said memory cell selecting means, a drain coupled to a corresponding bit line out of said first to fourth bit lines, a source coupled to a predetermined potential and a floating gate in which charges can be stored, and
- each of said first dummy cell and said second dummy cell comprises a control gate receiving an output of said dummy cell selecting means, a drain coupled to a corresponding bit line out of said first to fourth bit lines, a source coupled to said predetermined potential and a floating gate in which charges can be stored.

5. A semiconductor memory device in which information are read out by differential amplification, comprising:
- at least one first bit line pair comprising a first bit line and a second bit line,
- at least one second bit line pair comprising a third bit line and a fourth bit line,
- a plurality of memory cells each connected to either one of bit lines in said first bit line pair or said second bit line pair,
- a first dummy cell connected to either one of the bit lines in said first bit line pair,
- a second dummy cell connected to either one of the bit lines in said second bit line pair,
- at least one differential amplifier means having a first terminal and a second terminal for differentially amplifying a potential of said first terminal and a potential of said second terminal,
- memory cell selecting means for selecting any of said plurality of memory cells,
- dummy cell selecting means for selecting said second dummy cell when a memory cell connected to said first bit line pair is selected by said memory cell selecting means while selecting said first dummy cell when a memory cell connected to said second bit line pair is selected by said memory cell selecting means, and
- switching means for coupling said first or second bit line connected to a memory cell connected to said first bit line pair to the first temrinal of said corresponding differential amplifier means and coupling said third and fourth bit lines to the second temrinal of said corresponding differential amplifier means when the memory cell connected to said first bit line pair is selected by said memory cell selecting means, while coupling said third or fourth bit line connected to a memory cell connected to said second bit line pair to the second temrinal of said corresponding differential amplifier means and coupling said first and second bit lines to the first terminal of said corresponding differential amplifier means when the memory cell connected to second bit line pair is selected by said memory cell selecting means,
- which further comprises a plurality of word lines arranged intersecting with said first bit line and said second bit line or said third bit line and said fourth bit line and each connected to corresponding memory cells out of said plurality of memory cells,
- said memory cell selecting means being responsive to an address signal externally applied for selecting one of said plurality of word lines.

6. A semiconductor memory device in which information are read out by differential amplification, cmoprising:
- at least one first bit line pair comprising a first bit line and a second bit line, at least one second bit line pair comprising a third bit line and a fourth bit line,
a plurality of memory cells each connected to either one of bit lines in said first bit line pair or said second bit line pair,
a first dummy cell connected to either one of the bit lines in said first bit line pair,
a second dummy cell connected to either one of the bit lines in said second bit line pair,
at least one differential amplifier means having a first temrinal and a second terminal for differentially amplifying a potential of said first terminal and a potential of said second terminal,
memory cell selecting means for selecting any of said plurality of memory cells,
dummy cell selecting means for selecting said second dummy cell when a memory cell connected to said first bit line pair is selected by said memory cell selecting means while selecting said first dummy cell when a memory cell connected to said second bit line pair is selected by said memory cell selecting means, and
switching means for coupling said first or second bit line connected to a memory cell connected to said first bit line pair to the first terminal of said corresponding differential amplifier means and coupling said third and fourth bit lines to the second terminal of said corresponding differential amplifier means when the memory ell connected to said first bit line pair is selected by said memory cell selecting means, while coupling said third or fourth bit line connected to a memory cell connected to said second bit line pair to the second terminal of said corresponding differential amplifier means and coupling said first and second bit lines to the first terminal of said corresponding differential amplifier means when the memory cell connected to second bit line pair is selected by said memory ell selecting means,
wherein each of said plurality of memory cells, said first dummy cell and said second dummy cell have the same structure, and
wherein said nonvolatile memory cell each comprises an EEPROM memory cell.

7. The semiconductor memory device in which information is read out by differential amplification, comprising:
at least one first bit line,
at least one second bit line,
a plurality of memory cells each coupled between said first bit line or said second bit line and a predetermined potential and set to be rendered conductive when it is selected or set to be rendered nonconductive when it is selected,
reference potential generating means for generating a reference potential which is an intermediate potential of said predetermined potential,
a first dummy cell coupled between said first bit line and said reference potential generating means, which is rendered conductive when it is selected,
a second dummy cell coupled between said second bit line and said reference potential generating means, which is rendered conductive when it is selected,
memory cell selecting means for selecting any of said plurality of memory cells,
dummy cell selecting means for selecting said second dummy cell when a memory cell coupled to said first bit line is selected by said memory cell selecting means while selecting said first dummy cell when a memory cell coupled to said second bit line is selected by said memory cell selecting means, and
at least one differential amplifier means having a first terminal coupled to said first bit line and a second terminal coupled to said second bit line for differentially amplifying potentials of said first terminal and said second terminal.

8. The semiconductor memory device according to claim 7, wherein each of said plurality of memory cells, said first dummy cell and said second dummy cell have the same structure.

9. The semiconductor memory device in which information is read out by differential amplification, comprising:
at least one first bit line,
at least one second bit line,
a plurality of memory cells each coupled between said first bit line or said second bit line and a predetermined potential and set to be rendered conductive when it is selected or set to be rendered nonconductive when it is selected,
reference potential generating means for generating a reference potential which is an intermediate potential of said predetermined potential,
a first dummy cell coupled between said first bit line and said reference potential generating means, which is rendered conductive when it is selected,
a second dummy cell coupled between said second bit line and said reference potential generating means, which is rendered conductive when it is selected,
memory cell selecting means for selecting any of said plurality of memory cells,
dummy cell selecting means for selecting said second dummy cell when a memory cell coupled to said first bit line is selected by said memory cell selecting means while selecting said first dummy cell when a memory cell coupled to said second bit line is selected by said memory cell selecting means, and
at least one differential amplifier means having a first temrinal coupled to said first bit line and a second terminal coupled to said second bit line for differentially amplifying potentials of said first terminal and said second terminal,
wherein each of said plurality of memory cells, said first dummy cell and said second dummy cell each comprise a nonvolatile memory cell.

10. The semiconductor memory device according to claim 9, wherein
each of said plurality of memory cells have a control gate receiving an output of said memory cell selecting means, a drain coupled to a corresponding bit line out of said first to second bit lines, a source coupled to said predetermined potential and a floating gate in which charges can be stored, and
each of said first dummy cell and said second dummy cell comprises a control gate receiving an output of said dummy cell selecting means, a drain coupled to a corresponding bit line out of said first to second bit lines, a source coupled to said reference potential generating means and a floating gate in which charges can be stored.

11. A semiconductor memory device in which a reading operation of information is performed by differential amplification, comprising:
a pair of input/output lines, a plurality of flip-flop sense amplifiers, each of said flip-flop sense amplifiers having a first terminal which can be coupled to one of said pair of input/output lines and a second terminal which can be coupled to the other of said pair of input/output lines, a plurality of first columns each arranged on one side of each of said plurality of sense amplifiers, a plurality of second columns each arranged on the other side of each of said plurality of sense amplifiers, a plurality of first word lines arranged intersecting with said plurality of first columns, a plurality of second word lines arranged intersecting with said plurality of second columns, a first dummy word line arranged intersecting with said plurality of first columns, a second dummy word line arranged intersecting with said plurality of second columns, a row decoder for selecting any of said plurality of first and second word lines, dummy word line selecting means for selecting said second dummy word line when any of said plurality of first word lines is selected by said row decoder while selecting said first dummy word line when any of said plurality of second word lines is selected by said row decoder, and a column decoder for selecting one first column and one corresponding second column out of said plurality of first columns and said plurality of second columns and coupling the same to said pair of input/output lines, each of said plurality of first columns comprising a first bit line arranged intersecting with said plurality of first word lines, a second bit line arranged intersecting with said plurality of first word lines, a plurality of memory cells each provided at each of intersections of said plurality of first word lines and said first or second bit line, a first dummy cell connected to an intersection of said first dummy word line and said first or section bit line, a first switching element coupled between said first bit line and the first terminal of said sense amplifier, and a second switching element coupled between said second bit line and the first terminal of said sense amplifier, and each of said plurality of second columns comprising a third bit line arranged intersecting with sid plurality of second word lines, a fourth bit line arranged intersecting with said plurality of second word lines, a plurality of memory ells each connected to each of intersections of said plurality of second word lines and said third or fourth bit line, a second dummy cell connected to an intersection of said second dummy word line and said third or fourth bit line, a third switching element coupled between said third bit line and the second terminal of said sense amplifier, and a fourth switching element coupled between said fourth bit line and the second terminal of said sense amplifier, and switching means for turning said first switching element or said second switching element on and turning said third switching element and said fourth switching element on when any of said plurality of first word lines is selected by said row decoder while turning said third switching element or said fourth switching element on and turning said first switching element and said second switching element on when any of said plurality ofsecond word lines is selected by said row decoder.

* * * * *